(12) United States Patent
Chen

(10) Patent No.: US 7,785,949 B2
(45) Date of Patent: Aug. 31, 2010

(54) METHOD FOR FORMING SEMICONDUCTOR DEVICE USING MULTI-FUNCTIONAL SACRIFICIAL DIELECTRIC LAYER

(75) Inventor: Jyh-Huei Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 471 days.

(21) Appl. No.: 11/758,897

(22) Filed: Jun. 6, 2007

(65) Prior Publication Data

US 2008/0305601 A1 Dec. 11, 2008

(51) Int. Cl.
*H01L 21/336* (2006.01)
(52) U.S. Cl. ............... 438/197; 438/301; 438/528; 438/664; 257/E21.438
(58) Field of Classification Search ............... 438/197, 438/301, 303, 305, 528, 664; 257/E21.438
See application file for complete search history.

(56) References Cited

U.S. PATENT DOCUMENTS

| | | | |
|---|---|---|---|
| 6,040,223 A * | 3/2000 | Liu et al. | 438/303 |
| 6,187,655 B1 * | 2/2001 | Wang et al. | 438/528 |
| 6,326,289 B1 | 12/2001 | Rodder et al. | |
| 6,348,389 B1 | 2/2002 | Chou et al. | |
| 6,569,784 B1 | 5/2003 | Wang et al. | |
| 6,653,191 B1 | 11/2003 | Yang et al. | |
| 6,855,592 B2 | 2/2005 | Lee | |
| 6,989,302 B2 | 1/2006 | Makovicka et al. | |
| 2004/0209432 A1 * | 10/2004 | Ku et al. | 438/301 |
| 2006/0228843 A1 * | 10/2006 | Liu et al. | 438/197 |

FOREIGN PATENT DOCUMENTS

CN 1423317 A 6/2003

\* cited by examiner

*Primary Examiner*—Michael Trinh
(74) *Attorney, Agent, or Firm*—Duane Morris LLP

(57) ABSTRACT

A composite dielectric layer including a nitride layer over an oxide layer serves the dual function of acting as an SMT (stress memorization technique) film while an annealing operation is carried out and then remains partially intact as it is patterned to further serve as an RPO film during a subsequent silicidation process. The need to form and remove two separate dielectric material layers is obviated. The nitride layer protects the oxide layer to alleviate oxide damage during a pre-silicidation PAI (pre-amorphization implant) process thereby preventing oxide attack during a subsequent HF dip operation and preventing nickel silicide spiking through the attacked oxide layer during silicidation.

14 Claims, 7 Drawing Sheets

US 7,785,949 B2

METHOD FOR FORMING SEMICONDUCTOR DEVICE USING MULTI-FUNCTIONAL SACRIFICIAL DIELECTRIC LAYER

FIELD OF THE INVENTION

The present invention relates, most generally, to semiconductor devices and methods for manufacturing the same. More particularly, the present invention relates to an efficient method for annealing a semiconductor structure using the same sacrificial dielectric layer that will be used as a resist protect dielectric for a subsequent silicidation process.

BACKGROUND

In today's semiconductor manufacturing industry, it is critical to produce devices as rapidly as possible and as inexpensively as possible. A corollary to this is that it would be advantageous to produce any particular semiconductor device with a process fabrication sequence that involves the fewest number of processing operations and using the least amount of processing materials. It would clearly be advantageous to produce semiconductor devices with the same functionality, the same yield, and of the same quality, using a reduced number of processing operations and fewer processing materials.

According to conventional technology, when a semiconductor structure such as a transistor is annealed, a dielectric layer of one or more dielectric materials is maintained intact during the annealing process. The dielectric layer may serve as a stress memorization layer. This dielectric layer is then removed and a further dielectric is formed to use as a RPO (resist protect oxide) layer. The RPO is commonly formed over various structures and regions to protect the same during subsequent processing operations performed on the other structures and regions of the semiconductor substrate. The RPO may be patterned to expose portions of the underlying structures to be silicided, while protecting other portions from silicide formation during the subsequent silicidation process. This represents an area in which it would be beneficial to reduce the number of process operations and materials used. The present invention addresses this concern.

Another shortcoming associated with semiconductor manufacturing is related to the PIA (pre-amorphization implant)/silicidation process sequence. Conventionally, when an RPO oxide is formed and patterned prior to a silicidation process, the RPO oxide film becomes undesirably damaged during the pre-amorphization implant (PAI) advantageously used to amorphize exposed silicon surfaces prior to silicidation and while the RPO oxide is still in place. The RPO oxide damaged by the pre-silicidation PAI, is then undesirably attacked and removed by the conventionally-used pre-silicidation HF dip. This can cause silicide spikes in undesired areas especially when low activation energy metals such as nickel are used, and represents a further shortcoming in semiconductor manufacturing.

SUMMARY OF THE INVENTION

To address these and other needs and in view of its purposes, the present invention provides a method for forming a semiconductor device. According to one aspect, the method includes forming a gate structure over a semiconductor substrate and forming a dielectric material over the semiconductor substrate including over the gate structure. The method provides for maintaining the dielectric material over the gate structure during a rapid thermal annealing operation and also maintaining the dielectric material over portions of the gate structure and the semiconductor substrate while siliciding other portions of at least one of the semiconductor substrate and the gate structure.

According to one aspect, the dielectric material may be a silicon nitride layer formed over an oxide layer. The silicon nitride layer may include a tensile stress according to one exemplary embodiment.

According to another aspect, the invention provides a method for forming a semiconductor device, the method including forming a gate structure over a semiconductor substrate and forming a dielectric composite over the semiconductor substrate including over the gate structure. The method also provides for maintaining the dielectric composite over the semiconductor substrate and gate structure during rapid thermal annealing and removing the dielectric composite from first areas to be silicided thereby forming a patterned dielectric composite over second areas not to be silicided. The method further provides for performing a pre-amorphization implant (PAI) process and forming silicides in the first areas during a silicidation process in which the dielectric composite prevents silicidation in the second areas.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
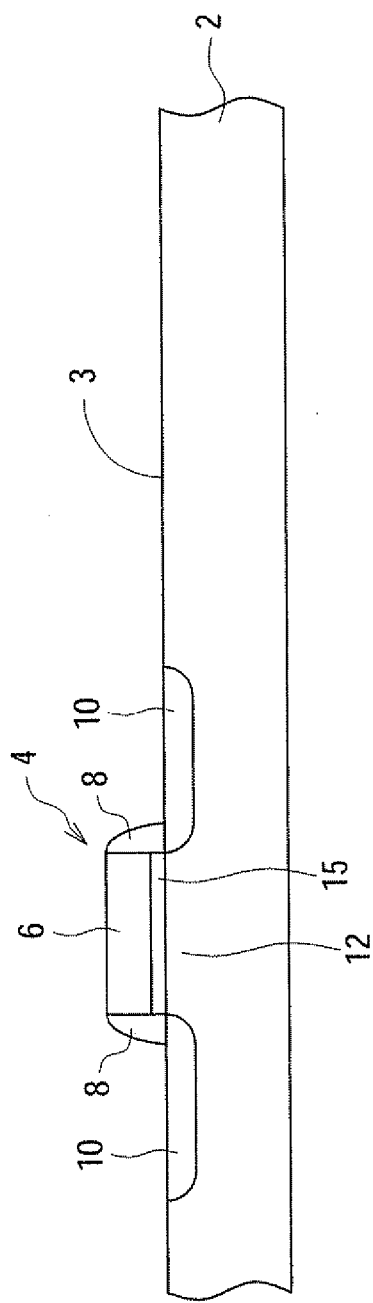
FIGS. 1-8 are cross-sectional views illustrating an exemplary sequence of processing operations according to one exemplary embodiment of the invention.

FIG. 1 is a cross-sectional view showing semiconductor device 4 and substrate 2. Substrate 2 may be a conventional semiconductor substrate such as silicon, gallium arsenide, or other suitable substrates used in the semiconductor manufacturing industry. Substrate 2 includes surface 3. In one exemplary embodiment, semiconductor device 4 may be a transistor such as an NMOS (N-type metal oxide semiconductor) or PMOS (P-type metal oxide semiconductor) transistor but other suitable semiconductor devices may be processed according to aspects of the invention, in other exemplary embodiments. In the illustrated embodiment, semiconductor device 4 includes gate electrode 6 formed over gate dielectric 15 formed over channel region 12. Gate electrode 6 may advantageously be formed of polysilicon or other suitable materials. Semiconductor device 4 additionally includes source/drain regions 10 disposed adjacent gate electrode 6, and spacers 8. Spacers 8 may be formed of a single material such as an oxide or a nitride or spacers 8 may alternatively represent layers or sections of more than one distinct material such as a combination of an oxide and nitride. Conventional fabrication methods may be used.

Figure 2:
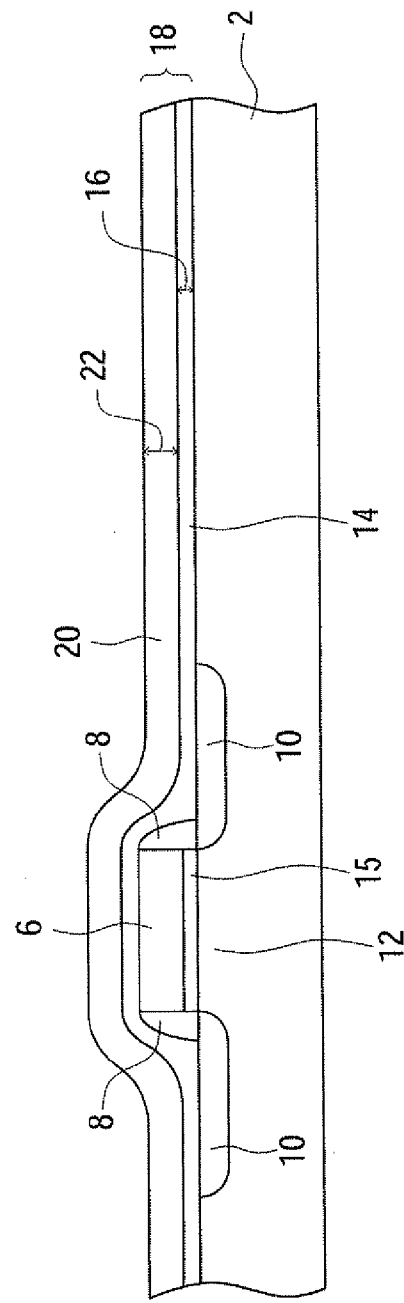

Prior to an annealing operation that will be carried out to anneal source/drain regions 10, composite dielectric layer 18 is formed over substrate 2 and semiconductor device 4 as shown in FIG. 2. Composite dielectric layer 18 includes nitride layer 20 formed over oxide layer 14. Oxide layer 14 may be a silicon dioxide layer formed using CVD, chemical vapor deposition, or other suitable non-thermal oxide formation practices. Oxide layer 14 includes thickness 16 which may be 30 angstroms in one exemplary embodiment, or may range from 40-150 angstroms or have other suitable thicknesses according to other exemplary embodiments. Nitride layer 20 may advantageously be a silicon nitride, SiN, layer and formed using conventional methods. Thickness 22 of nitride layer 20 may include a minimal thickness of about 300 angstroms and may be 500 angstroms according to one advantageous embodiment. Thickness 22 may vary from 300-800 angstroms or have other suitable thicknesses according to other exemplary embodiments. Dielectric layer 18 may advantageously serve as a stress memorization material that remains in place during a subsequent annealing operation. According to one exemplary embodiment in which an SMT, stress memorization technique, is used, nitride layer 20 may be a high-tensile stress nitride layer selectively deposited upon semiconductor device 4 which may be an NMOS transistor with gate electrode 6 formed of polysilicon. The use of nitride layer 20 as a stress memorization material is particularly advantageous in sub-65 nm high performance devices. According to one embodiment, the high-tensile stress nitride layer effects the channel stress beneath gate electrode 6 and the channel stress remains after removal of nitride layer 20. In other exemplary embodiments, oxide layer 14 may represent the stressed film. The stress may be created or enhanced by a subsequent annealing operation. The enhanced strain effect improves transistor performance and, in particular, transistor drive current.

An annealing operation is carried out upon the structure shown in FIG. 2 and may advantageously be a rapid thermal anneal, RTA, process with a temperature spike within the range of 1000-1200° C. but other suitable annealing parameters may be carried out to anneal source/drain regions 10 in other exemplary embodiments.

Figure 3:
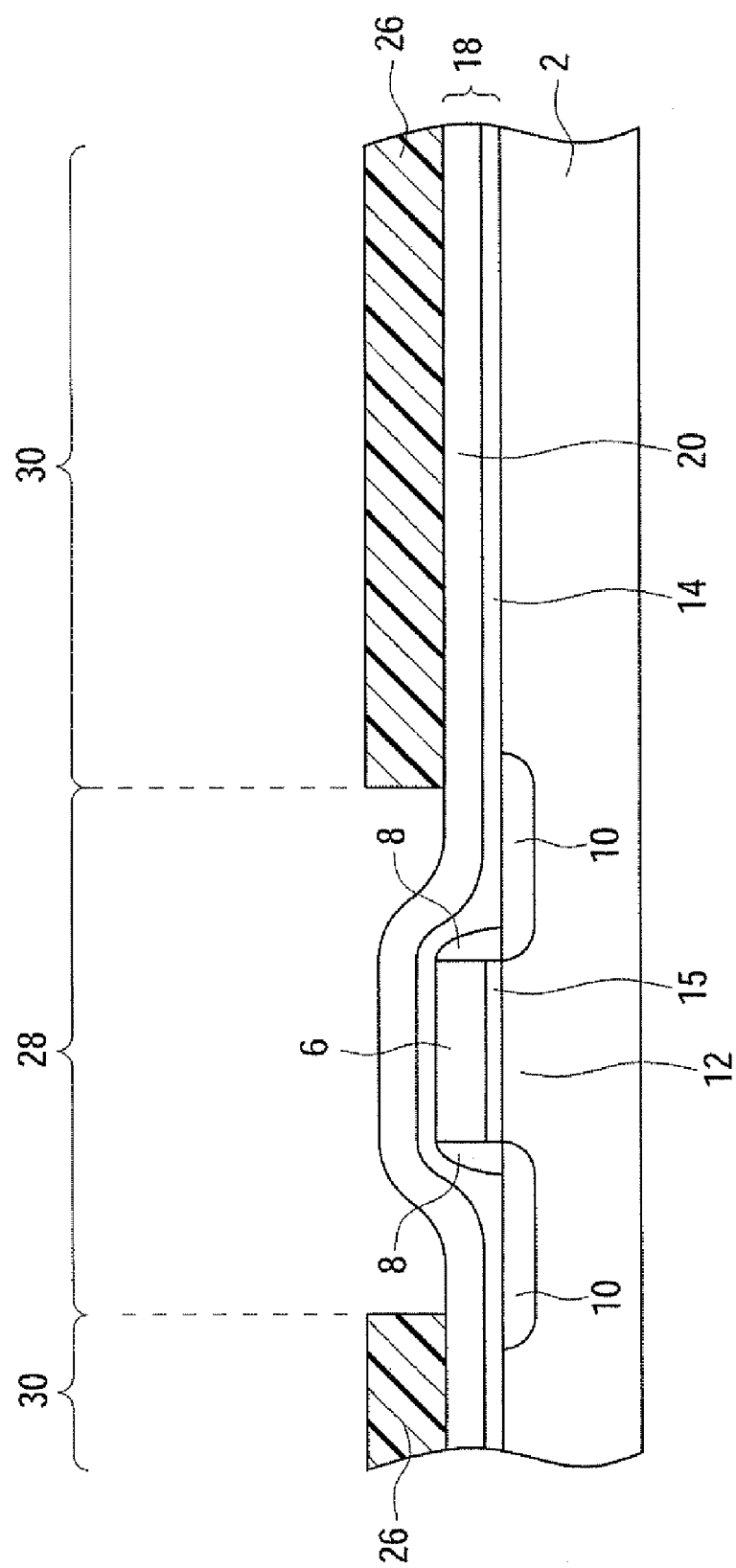
Figure 4:
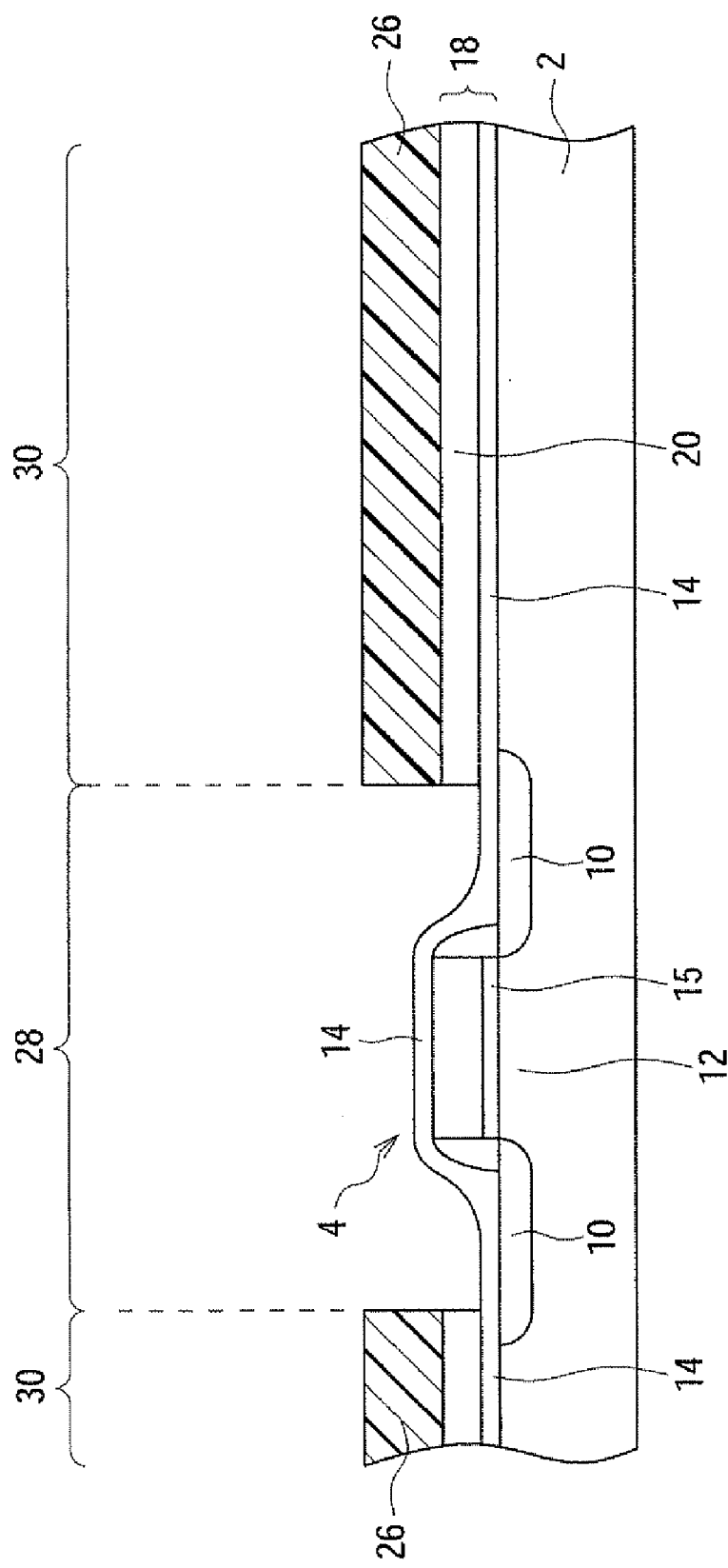

FIG. 3 shows the structure of FIG. 2 after photosensitive layer 26 is formed thereover then patterned to form patterned photosensitive layer 26. Patterned photosensitive layer 26 is present in areas 30 which will be protected during subsequent silicidation processes and photosensitive layer 26 is absent from uncovered area 28 which represents the area within which silicidation will occur. Conventional photoresist materials may be used as photosensitive layer 26 and conventional methods may be used to pattern photosensitive layer 26. FIG. 4 shows the structure in FIG. 3 after an etching operation has been carried out to remove portions of nitride layer 20 from uncovered area 28. In one exemplary embodiment, a dry plasma etching operation may be used and the plasma etching operation may advantageously include an automatic end-pointing technique that automatically terminates the etching operation when nitride layer 20 is completely removed and the subjacent oxide layer 14 is substantially completely exposed. Various plasma etching operations for etching silicon nitride are available in the art.

Figure 5:
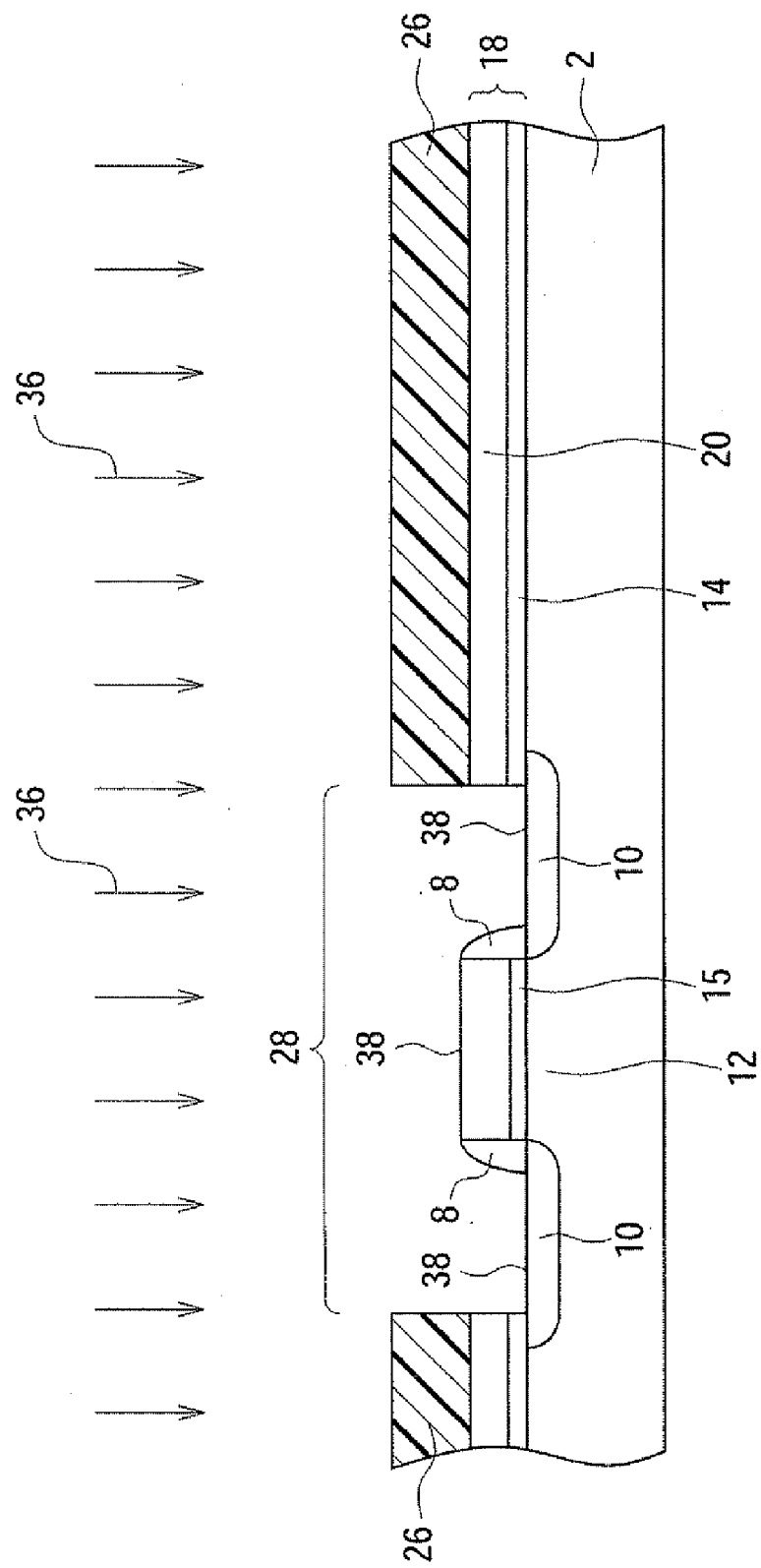

A wet etching operation may be carried out upon the structure shown in FIG. 4, to remove oxide layer 14 from uncovered area 28 and produce the structure shown in FIG. 5. Referring to FIG. 5, both nitride layer 20 and oxide layer 14 are removed from area 28 to expose the underlying structures in uncovered area 28, including silicon surfaces 38. After oxide film 14 is removed from uncovered area 28, a pre-silicidation pre-amorphization implant (PAI) is carried out with dielectric layer 18 still present in areas 30 that are to be protected from silicidation during a subsequent silicidation process. Dielectric layer 18 thus serves as the RPO oxide in this manner. In one exemplary embodiment, photosensitive layer 26 may still be in place during the PAI process and in another exemplary embodiment, patterned photosensitive layer 26 may be completely removed prior to the PAI process. The PAI implant is represented by arrows 36 indicating the introduction of impurities into the illustrated structure. The PAI is a high energy, high dosage implant used to amorphisize exposed silicon surfaces 38 so as to effectuate more complete silicidation during the metal deposition and treating processes that will be carried out subsequently. During the PAI process, an argon gas may be injected into the semiconductor substrate at an energy that may range from 10 KeV to 20 KeV but other high energies may be used in other exemplary embodiments. In other PAI implants, other suitable heavy elements such as Me, As, Gi, In, Ge, Tl or other suitable heavy elements may be used in other exemplary embodiments. The dosage may be at least 1E13 atoms/cm$^2$ but other implant dosages may be used in other exemplary embodiments. The pre-amorphization implant at least partially amorphizes exposed silicon surfaces 38. The presence of nitride layer 20 prevents damage or attack of oxide layer 14 during the high energy PAI process. After the PAI process is complete and photosensitive layer 26 removed, the semiconductor structure including semiconductor device 4 undergoes a pre-silicidation HF dip.

Figure 6:
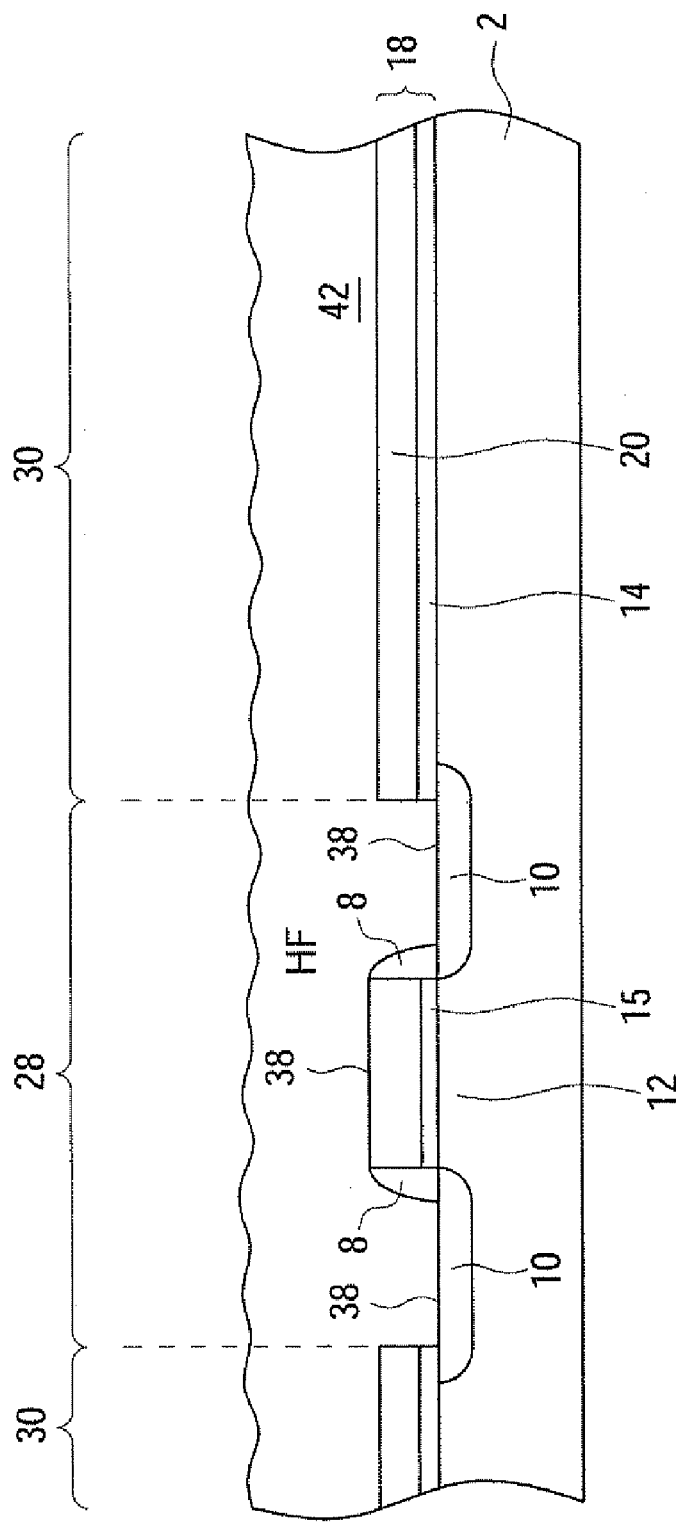

In the pre-silicidation HF dip illustrated in FIG. 6, a liquid hydrofluoric acid solution 42 is contacted to the semiconductor substrate to remove any native oxides that may form, in particular, on exposed silicon surfaces 38. With nitride layer 20 still in place, subjacent oxide layer 14 is not attacked by the HF solution and any potential silicidation in areas 30 is avoided during any subsequent silicidation processes, i.e., silicide spiking through dielectric layer 18 is avoided.

Figure 7:
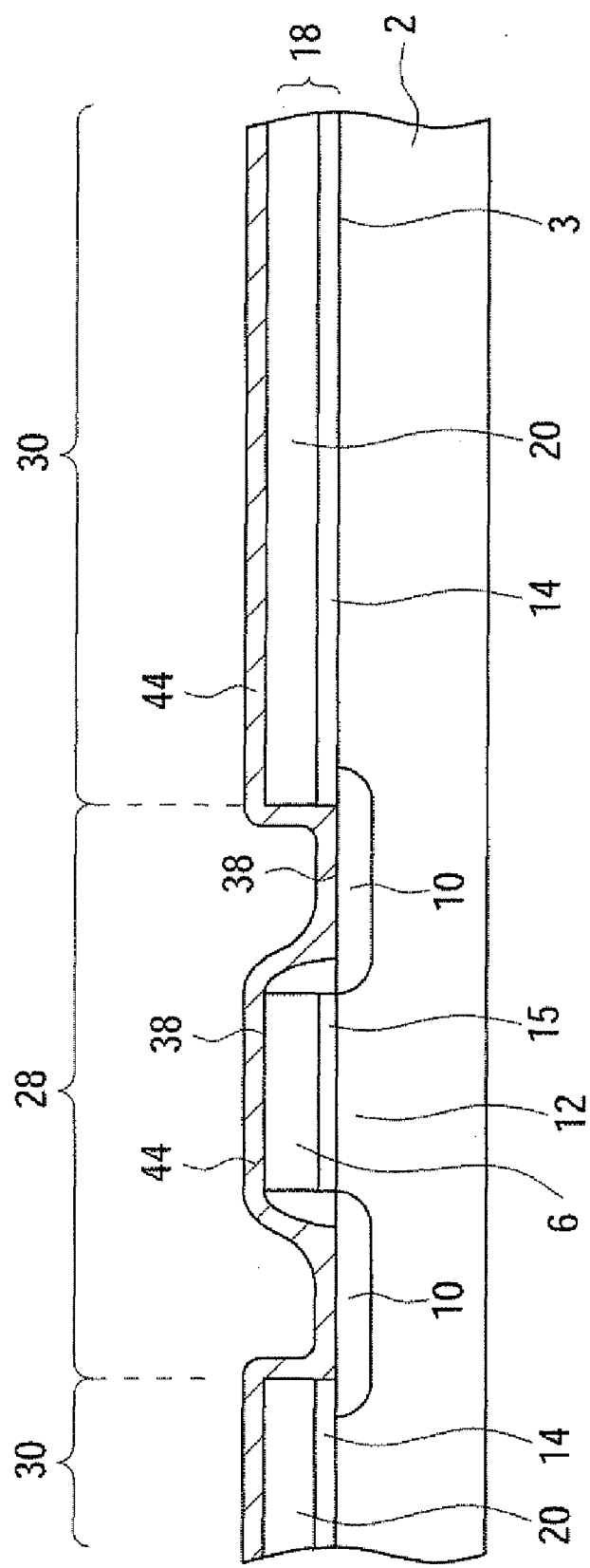

After the "wet" HF dip shown in FIG. 6, metal film 44 is deposited on exposed silicon surfaces 38 within uncovered area 28 and over dielectric layer 18 in areas 30 as shown in FIG. 7. Metal film 44 may be nickel, cobalt, or other suitable metals used to form silicides. Nickel, in particular, requires a low activation energy for forming NiSi. With dielectric layer 18 in place in areas 30, the occurrence of nickel silicide formation through damaged portions of the dielectric layer in areas 30, as would otherwise occur using conventional methods, is avoided according to the method of the invention. Using conventional technology, nickel silicide spikes may have occurred through voids formed through the oxide dielectric. The structure in FIG. 7 is heated to a suitable temperature either during or after the deposition of metal film 44, or both, and the portions of metal layer 44 that contact exposed silicon surfaces 38, form silicides therewith. The presence of dielectric layer 18 prevents silicide formation in areas 30 as it isolates metal layer 44 from structures on or in surface 3 during the silicidation process.

Figure 8:
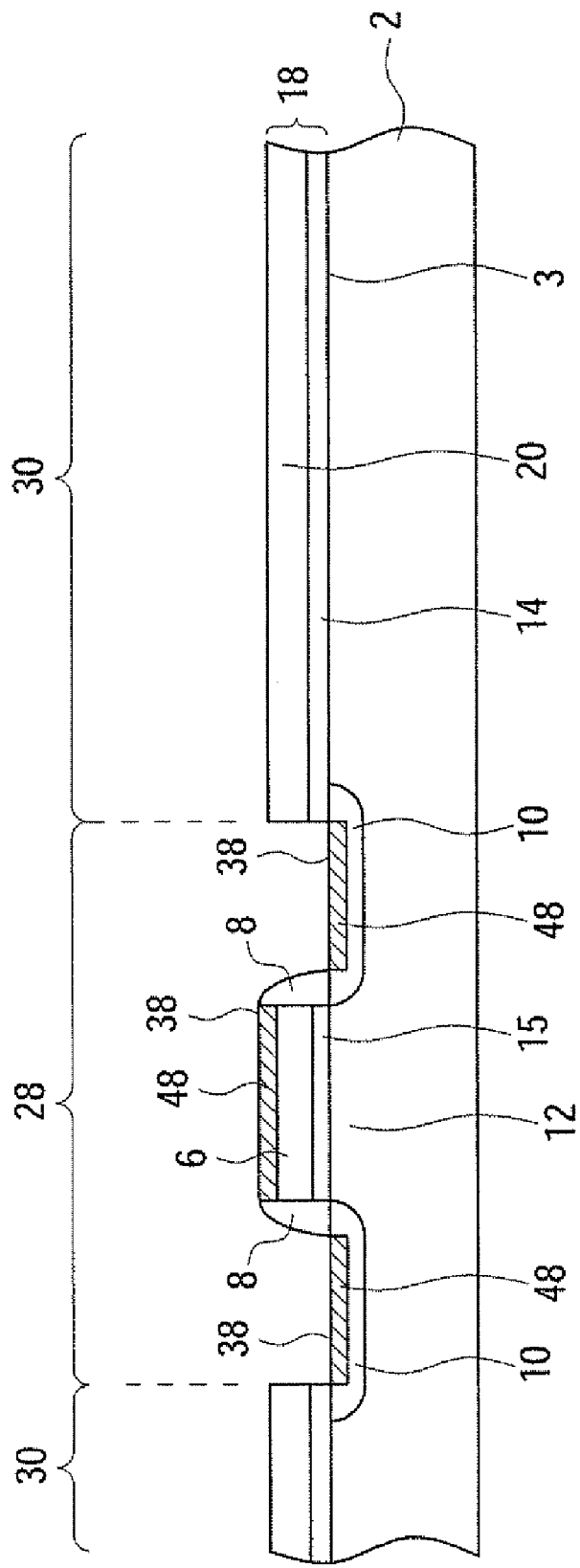

FIG. 8 shows the structure of FIG. 7 after a silicidation process has been carried out to form metal silicides 48 on exposed silicon surfaces 38 in uncovered area 28 and the unreached portions of metal film 44 removed using conventional methods. Metal silicide 48 represents the combination of metal from metal layer 44 (FIG. 7) with silicon from silicon surface 38. If can be seen that metal silicide 48 forms only on exposed silicon surfaces 38 in uncovered area 28. In other exemplary embodiments, other semiconductor devices and/or portions of semiconductor devices may be alternatively covered with dielectric layer 18 for the prevention of silicides or may be exposed after a pattern is formed of dielectric layer 18. The silicidation technique shown in FIGS. 7-8 in which the portions to be silicided are self-aligned, may be referred to as a silicidation process.

The preceding merely illustrates the principles of the invention. If will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal" "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the device is formed in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semiconductor device, said method comprising:
    forming a gate structure over a semiconductor substrate; and
    forming a dielectric material comprising a composite layer of a silicon nitride layer over an oxide layer, over said semiconductor substrate including over said gate structure such that said silicon nitride layer is formed to include a tensile stress and impart said tensile stress upon a channel disposed beneath said gate structure;
    maintaining said dielectric material over said semiconductor substrate including over said gate structure during a rapid thermal annealing operation; and
    maintaining said dielectric material over portions of said semiconductor substrate and said gate structure during a silicidation operation, while siliciding other portions of at least one of said semiconductor substrate and said gate structure during said silicidation operation.

2. The method as in claim 1, further comprising maintaining said dielectric material over said portions of said gate structure and said semiconductor substrate during a pre-amorphization implant carried out before said silicidation and in which said pre-amorphization implant at least partially amorphizes exposed silicon surfaces in said other portions but does not damage said dielectric material.

3. The method as in claim 2, wherein said pre-amorphization implant includes an implant energy of at least 15 KeV, a dose of at least 2E13 atoms/$cm^2$, and includes implanting at least one of argon, gallium, indium, germanium, and thallium.

4. The method as in claim 2, further comprising contacting said substrate with a wet HF solution while maintaining said dielectric material over portions of said gate structure and said semiconductor substrate and prior to said siliciding.

5. The method as in claim 1, wherein said dielectric material is maintained over said semiconductor substrate but not said gate structure during said silicidation operation and wherein said silicidation operation comprises forming a nickel silicide on exposed portions of said gate structure.

6. A method for forming a semiconductor device, said method comprising:
    forming a gate structure over a semiconductor substrate;
    forming a dielectric composite of a silicon nitride layer over an oxide layer, over said semiconductor substrate including over said gate structure such that said silicon nitride layer is formed to include a tensile stress and impart said tensile stress upon a channel disposed beneath said gate structure, and maintaining said dielectric composite thereover during rapid thermal annealing;
    removing said dielectric composite from first areas to be silicided thereby forming a patterned dielectric composite over second areas not to be silicided;
    performing a pre-amorphization implant process with said patterned dielectric composite in place; and
    forming silicides in said first areas during a silicidation process with said dielectric composite preventing silicidation in said second areas during said silicidation process.

7. The method as in claim 6, wherein said pre-amorphization implant includes implanting at least one of argon, gallium, indium, germanium, and thallium.

8. The method as in claim 6, wherein said pre-amorphization implant includes an implant energy of at least 15 KeV and an implant dose of at least 2E13 atoms/$cm^2$ and at least partially amorphizes exposed silicon surfaces in said first areas.

9. The method as in claim 6, wherein said oxide layer is formed by chemical vapor deposit and includes a thickness of at least 50 angstroms and said silicon nitride includes a thickness of at least 300 angstroms.

10. The method as in claim 6, wherein said removing comprises plasma etching said silicon nitride layer and terminating said plasma etching using automatic endpointing techniques, and wet etching to remove said oxide layer.

11. The method as in claim 6, further comprising contacting said substrate with a wet HF solution after said pre-amorphization implant and prior to said forming a silicide and wherein said pre-amorphization implant and said exposing said substrate to said wet HF solution does not attack said oxide layer.

12. The method as in claim 6, wherein said silicides comprise nickel silicide.

13. The method as in claim 6, wherein said rapid thermal annealing includes a maximum temperature within the range of 1100-1200° C.

14. The method as in claim 6, wherein said forming silicides in said first areas with said dielectric composite preventing silicidation in said second areas, comprises forming a metal film over said patterned dielectric composite and said semiconductor substrate including said gate structure, then heating.

* * * * *

UNITED STATES PATENT AND TRADEMARK OFFICE
CERTIFICATE OF CORRECTION

PATENT NO.        : 7,785,949 B2                                    Page 1 of 1
APPLICATION NO.   : 11/758897
DATED             : August 31, 2010
INVENTOR(S)       : Chen It is certified that error appears in the above-identified patent and that said Letters Patent is hereby corrected as shown below:

Column 3, line 3, replace "30" with --80--
Column 4, line 54, replace "unreached" with --unreacted--
Column 4, line 57, replace "If" with --It--
Column 4, line 67, replace "If" with --It--

Signed and Sealed this
Thirty-first Day of May, 2011

David J. Kappos
*Director of the United States Patent and Trademark Office*